United States Patent [19]

Shiraiwa

[11] Patent Number: 5,203,445
[45] Date of Patent: Apr. 20, 1993

[54] CARRIER CONVEYING APPARATUS

[75] Inventor: Hirotsugu Shiraiwa, Tokyo, Japan

[73] Assignee: Tokyo Electron Sagami Limited, Kanagawa, Japan

[21] Appl. No.: 736,647

[22] Filed: Jul. 26, 1991

[30] Foreign Application Priority Data

Mar. 17, 1990 [JP] Japan .................................. 2-216910

[51] Int. Cl.$^5$ .............................................. B65G 43/08
[52] U.S. Cl. .............................. 198/464.3; 198/346.1; 198/465.1; 198/468.6; 414/751; 414/DIG. 6
[58] Field of Search ................ 198/345.3, 346.1, 464.3, 198/465.1, 468.6, 774.2, 803.01, 395, 751; 414/222, 750, DIG. 6

[56] References Cited

U.S. PATENT DOCUMENTS

| | | | |
|---|---|---|---|
| 3,590,987 | 7/1971 | Evans | 198/751 |
| 3,881,605 | 5/1975 | Grossman | 198/751 |
| 4,217,978 | 8/1980 | Stalker | 198/345.3 |
| 4,449,885 | 5/1984 | Hertel et al. | 414/750 |
| 4,955,775 | 9/1990 | Ohkase et al. | 414/222 |

Primary Examiner—Joseph E. Valenza
Attorney, Agent, or Firm—Oblon, Spivak, McClelland, Maier & Neustadt

[57] ABSTRACT

A carrier conveying apparatus comprises a first carrier rest for placing carriers thereon, a second carrier rest to which the carriers are conveyed, a carrier holding member for holding a plurality of carriers at a time from below, a liftably moving mechanism for liftably moving the carrier holding member and a horizontally moving mechanism provided over a distance from below the first carrier rest to a position below the second carrier rest to horizontally move the carrier holding member and liftably moving mechanism. The liftably moving mechanism lifts the carrier holding member from below the first carrier rest and hence lifts the carriers placed on the first carrier rest in a manner to hold them by the carrier holding member. Then the horizontally moving means horizontally moves the carrier holding member and liftably moving mechanism to a position above the second carrier rest. Then the liftably moving mechanism lowers the carrier holding member to place the carriers on the second carrier rest.

27 Claims, 12 Drawing Sheets

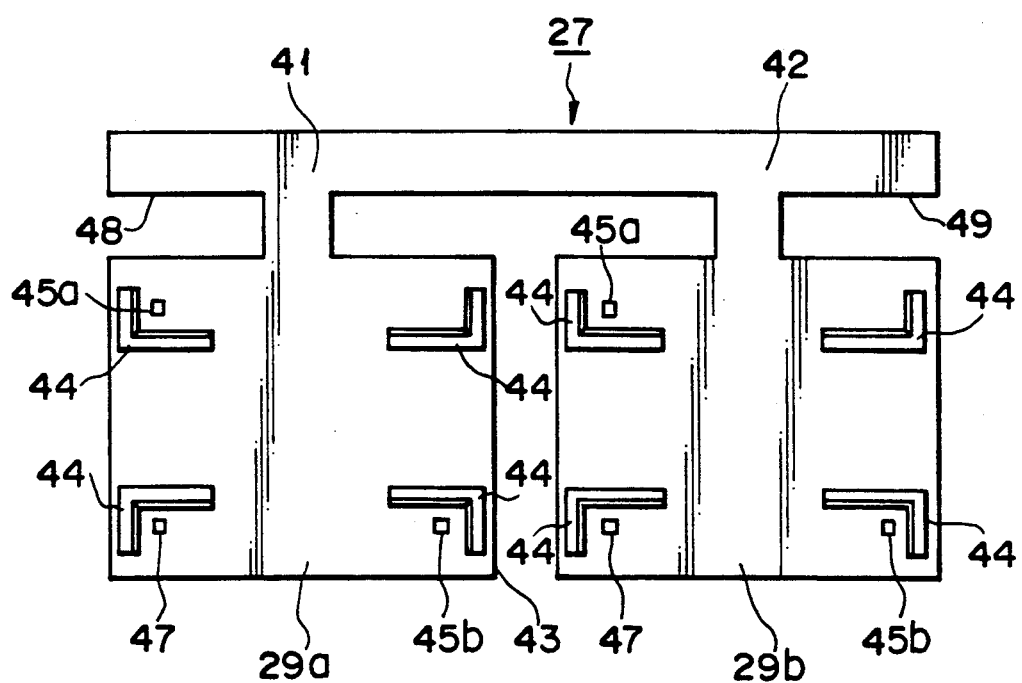
F I G. 4

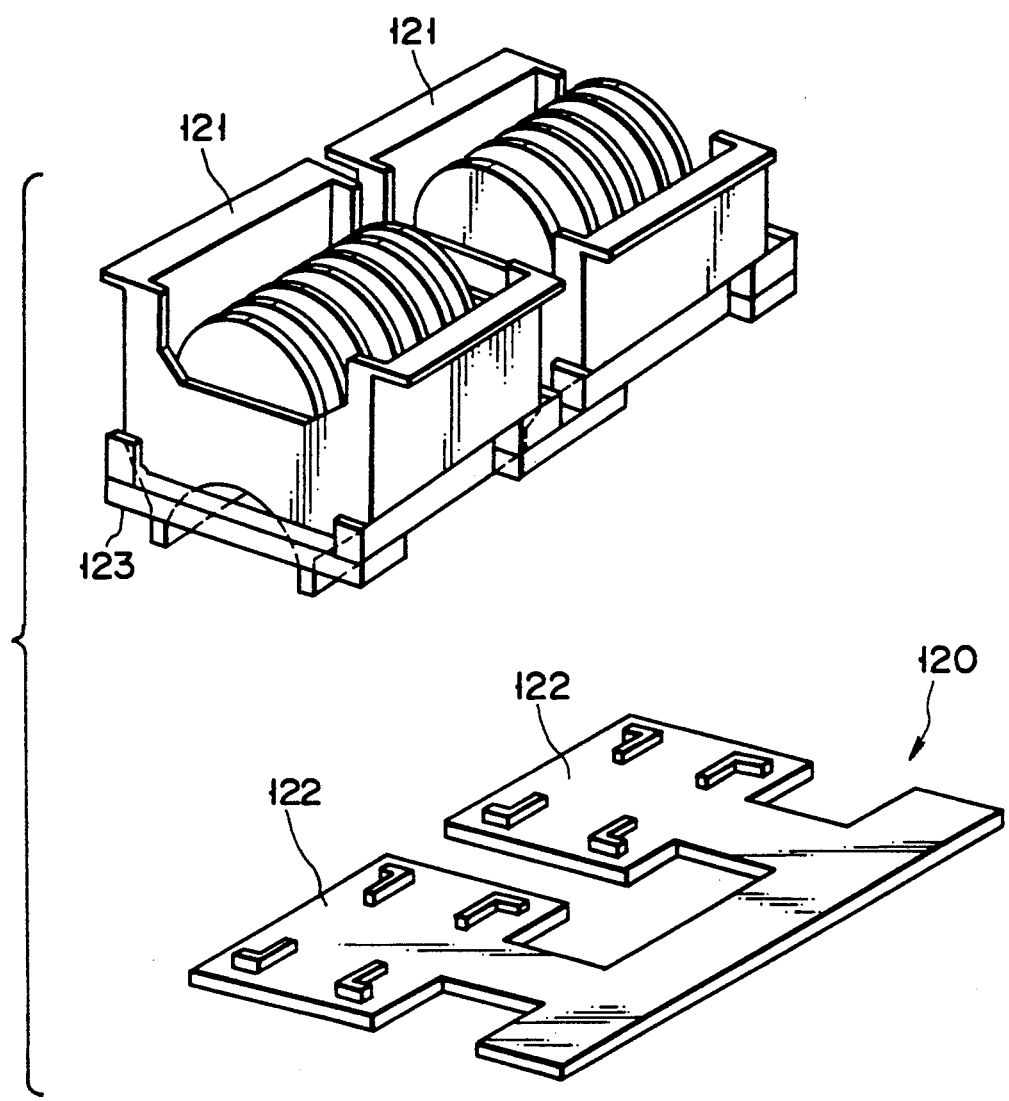
F I G. 11

CARRIER CONVEYING APPARATUS

BACKGROUND OF THE INVENTION

1. Field of the Invention

The present invention relates to a carrier conveying apparatus.

2. Description of the Prior Art

In a semiconductor heat-treating device, etc., a carrier conveying apparatus has been employed which conveys a carrier with a plurality of semiconductor wafers substantially vertically held in a spaced-apart relation.

An apparatus having a gripping means for gripping carriers from above is conventionally known as a carrier conveying apparatus. The carriers are conveyed by a gripping means-equipped carrier conveying apparatus as will be set out below. First, the gripping means is moved, by liftably moving means and horizontally moving means, to a desired height above the carrier. Then, the gripping means is opened at the desired position and lower toward the carrier. The gripping means, upon reaching a given position, stops its lowering and grips the carrier by closing the gripping means. The gripping means is moved in a lifting motion and in a horizontal motion with the carrier gripped thereby. The gripping means, upon reaching a desired position, releases the carrier with the gripping means opened and place the carrier in place.

In the case where the carrier is gripped and conveyed to the predetermined position, for example, dust, etc., is raised upon the opening and closing operate the gripping means from a sliding part of the gripping means, falling on the surfaces of wafers in the carrier. In this way, the dust is deposited there. As a result, drop in the yield of semiconductor devices, which are finished products, results.

SUMMARY OF THE INVENTION

The object of the present invention is to provide a carrier conveying apparatus which can avoid the deposition of dust on a wafer surface by handling of the carrier.

The object of the present invention is achieved by the carrier conveying apparatus which can hold a carrier from below a carrier rest with the carrier placed on the carrier rest and move it to a desired position in a lifting motion and in a horizontal motion without operating, for example, a holding means above the carrier which would cause occurrence of dust.

According to the present invention, there is provided a carrier conveying apparatus comprising:

a first carrier rest on which carriers are placed, said carriers being able be held a plurality of plates, a second carrier rest, a carrier holding member for holding carriers from beneath, and a carrier holding member driving mechanism for lifting the carrier holding member from beneath the first carrier rest and, by doing so, lifting the carriers which are placed on the first carrier rest with the carriers held by the carrier holding member, moving the carrier holding member in a horizontal direction and placing the carriers on the second carrier rest after the carrier holding member has been lowered toward the second carrier rest.

According to the carrier conveying apparatus of the present invention, since the carrier holding member conveys carriers in a manner to lift the carriers from beneath, dust, etc., even if being raised, is less likely to be deposited onto wafers in the carrier Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a plan view showing a port in the embodiment of the present invention;

FIG. 11 is a perspective view for showing a port and a carrier holding member in another embodiment of the present invention.

DETAILED DESCRIPTION OF THE PREFERRED EMBODIMENTS

Applying a carrier conveying apparatus of the present invention to a stock unit will be explained in more detail below with reference to the accompanying drawings.

Figure 1:
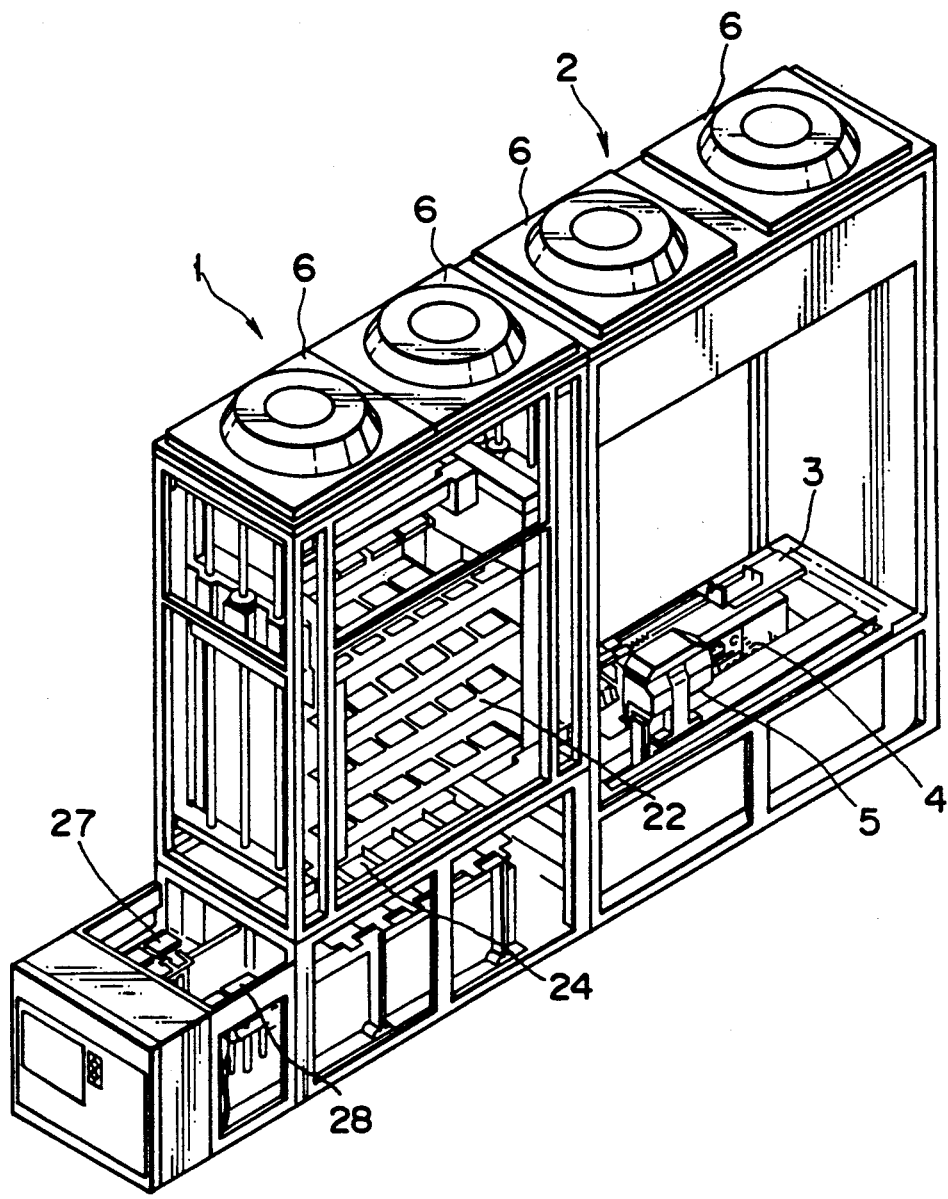
FIG. 1 is a perspective view showing a stock unit containing a carrier conveying apparatus according to an embodiment of the present invention.

The stock unit is provided at the preceding stage of an apparatus for heat-treating a semiconductor wafer. As shown in FIG. 1, a wafer transfer mechanism 2 permits automatic transfer to be made between wafer carriers send from the stock unit 1 and capable of storing, for example, 25 sheets each and a wafer boat for heat treatment which is made of, a heat-resistant material (i.e. quartz) and capable of placing 100 to 150 wafers therein. The wafer transfer mechanism 2 comprises a boat holding mechanism 3, a wafer push-up motion mechanism 4 and a wafer chuck moving mechanism 5.

The boat holding mechanism 3 places the wafer boat to a predetermined position. The wafer push-up motion mechanism 4 enables a row of wafers which are placed in the wafer carrier or the wafer boat to be pushed up from below at a time when the wafers are to be transferred. The wafer chuck moving mechanism 5 grips the wafer row pushed up from the wafer push-up motion mechanism 4 to allow the wafer row to be transferred from the wafer carrier to the wafer boat or from the wafer boat to the wafer carrier.

Figure 2:
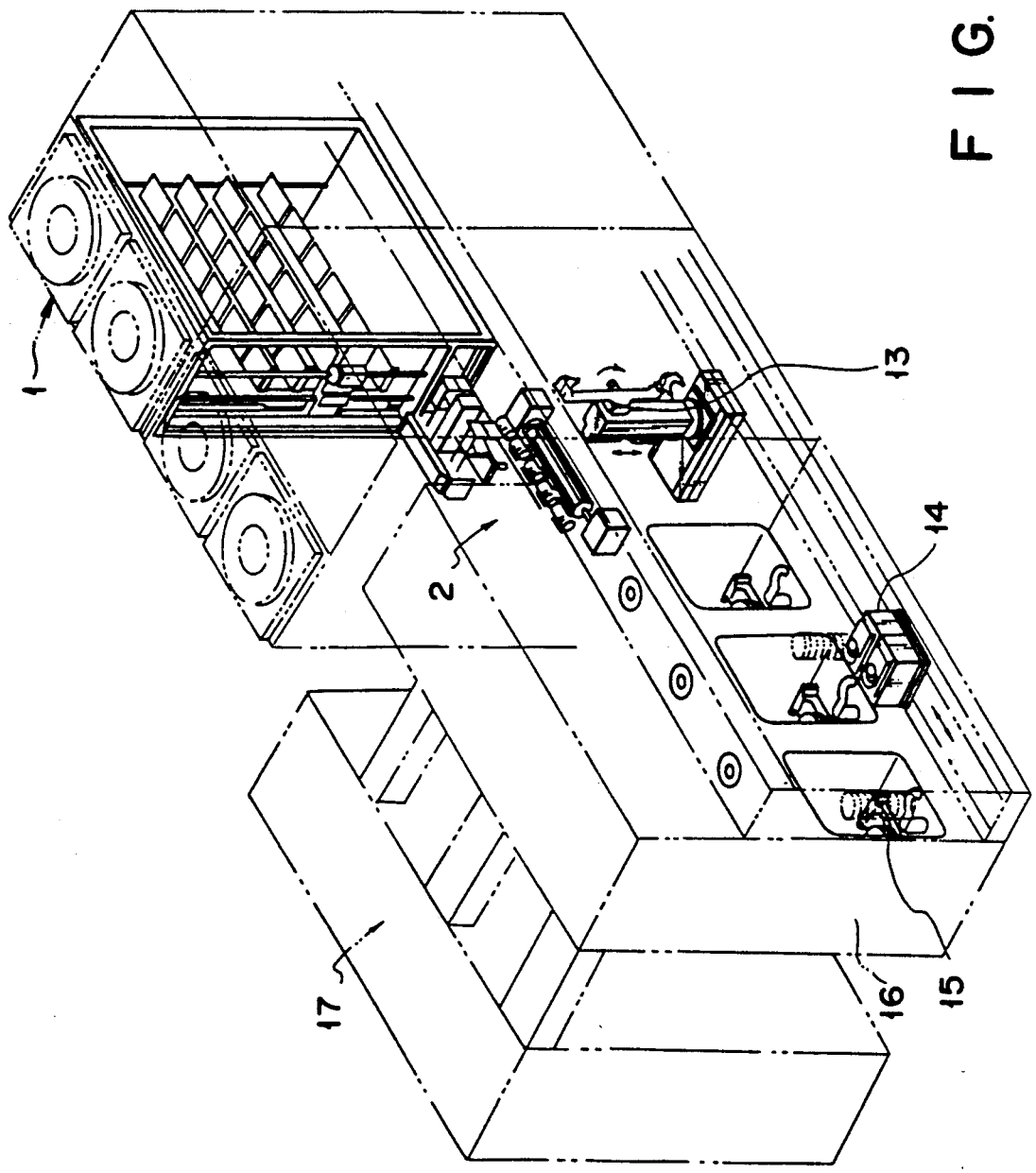
FIG. 2 is a perspective view showing a semiconductor heat-treating device containing the stock unit of FIG. 1.

At a subsequent stage of the wafer transfer mechanism 2, as shown in FIG. 2 a boat transfer mechanism 13, boat conveying mechanism 14, elevator 15, furnace 16 and gas supply source 17 are sequentially provided. The boat transfer mechanism 13 allows the wafer boat to be transferred between the wafer transfer mechanism 2 and the boat conveying mechanism 14. The boat conveying mechanism 14 allows the wafer boat which is transferred by the boat transfer mechanism 13 to be conveyed to a front of the furnace 16. The elevater 15 allows the wafer boats to be carried up in the furnace 16. The furnace 16 is of a vertical heat-treating type capable of heat-treating a greater number of wafers at a time. In the furnace 16, a resistance heating type heater is provided around a process tube for performing a desired oxidation, diffusion, CVD treatment, and so on. The gas supply source 17 supplies a predetermined process gas into the process tube in the furnace 16.

An air fan (see 6 in FIG. 1), HEPA filter and delivery fan, not shown, are provided in the stock unit 1, transfer mechanism 2, boat transfer mechanism and boat conveying mechanism which are provide in a clear room to feed clean air to a carrier-stock position and in parallel to each wafer surfaces as a down flow stream.

Figure 3:
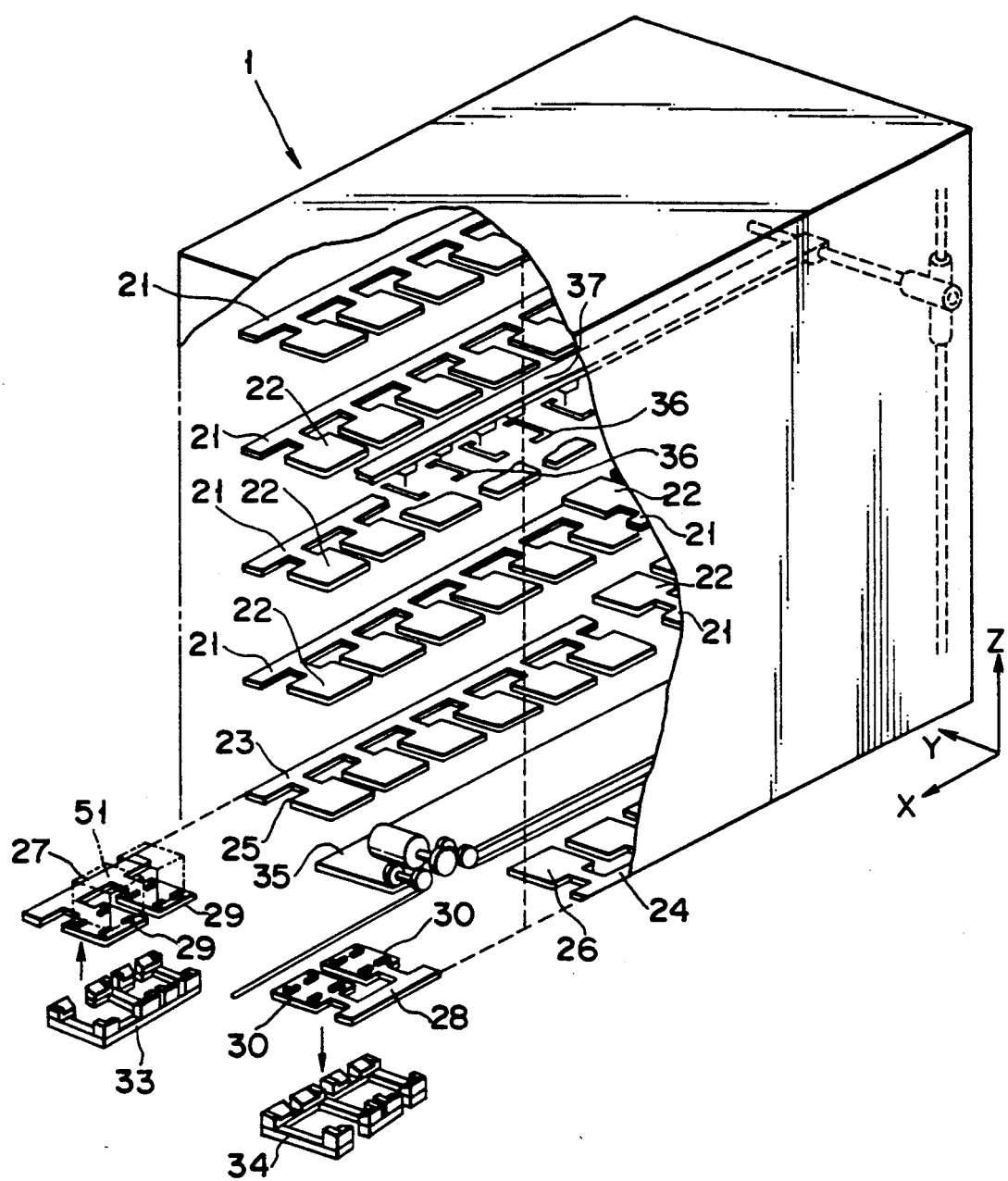
FIG. 3 is a diagrammatic view showing a major section of the stock unit of FIG. 1.

Shelves 21, right and left, are arranged in a plurality of stages (for example, four stages) in the stock unit 1 as shown in FIG. 3 to place and stock carriers thereon. The shelves 21 include a plurality of carrier rests 22. For example, the shelf 21 has a continuous unit of six carrier rests. Each of positions to place each of carriers on the shelves 21 is defined as addresses confirming clearly kinds of wafers order of wafers to be processed and kinds of process performed on wafers. The addresses are registrated in a computer.

The carrier is comprised of a casing with, for example, 25 wafers vertically held upright in a mutually spaced-apart relation. Normally, the opposite side portions of the carrier are inclined from their intermediate portions toward its bottom with a pair of leg portions provided in parallel each other.

An IN-side station 23 and OUT-side station 24 are provided on the lowest shelves 21, right and left. The IN- and OUT-side stations 23 and 24 include six carrier rests 25 and 26, respectively, as in the case of the shelves 21.

A carrier plate 35 for conveying a plurality of (for example, six) carriers thereon is located between the IN-side station 23 and the OUT-side station 24 such that it can be moved in the X-axis direction as shown in FIG. 3.

A carrier arm 37 is located within the stock unit 1 such that it can be moved in the Y- and Z-axis directions in FIG. 3. The carrier arm 37 includes six holding mechanisms 36 for holding the carriers.

An IN-side port 17 is fixed in the front portion of the stock unit 1 at a preceding stage of the IN-side station 23 and the same height level as that of it. Similarly, an OUT-side port 28 is fixed at a preceding stage of the OUT-side station 24 at the same height level as the OUT-side station 24.

A pair of carrier rests (29, 30) are provided at each of the IN- and OUT-side ports 27 and 28. As shown in FIG. 4, the pair of carrier rests 29a, 29b in the IN-side port 27 are rectangular in configuration each. The carrier rests 29a and 29b are narrowed at their base end portions to provide a T-like groove 43 at an area between the carrier rests 29a and 29b. Grooves 48 and 49 are provided one outside of base portions 41 and 42.

An L-shaped clamp 44 is provided at four corner portions of the carrier rest (29a, 29b) to prevent a slippage of the carrier placed on the carrier rest (29a, 29b).

A pair of carrier presence/absence identification sensors 45a, 45b are provided at each of the carrier rests 29a, 29b, one at the diagonal corners. A carrier reverse placement detecting sensor 47 can be provided at one of the four corners of each of the carrier rests 29a and 29b to detect the reverse placement of the carrier as required. The carrier presence/absence identification sensor (45a, 45b) detects the placement of the carrier on the carrier rest (29a, 29b). When the carrier presence/absence identification sensors 45a and 45b are turned ON, a control section determines that carriers are placed on the carrier rests 29a and 29b.

Figure 5:
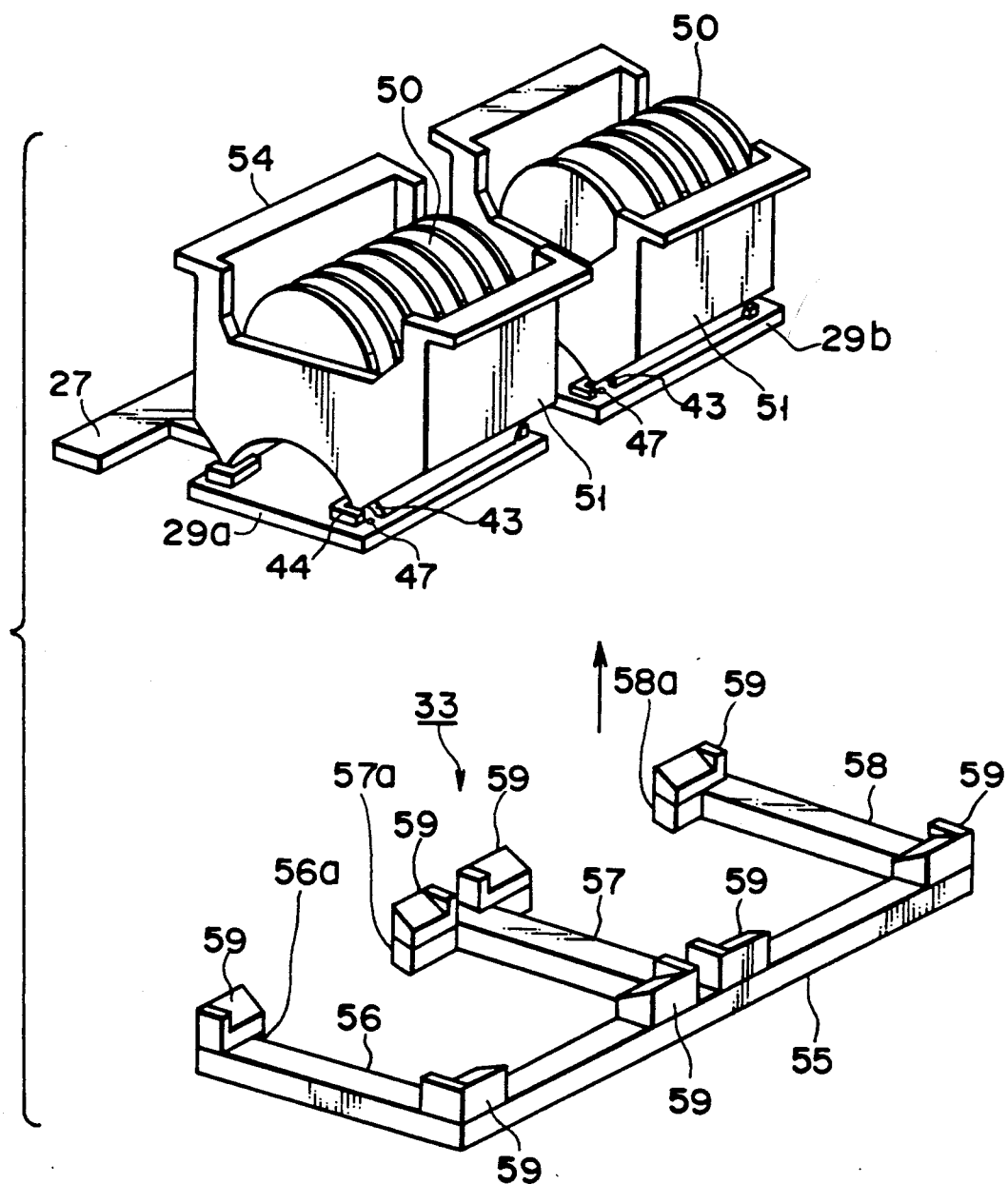
FIG. 5 is a perspective view showing a port and carrier holding member in the embodiment of the present invention.

The carrier reverse placement detecting sensor 47 identifies the direction in which the carrier is placed on the carrier rest (29a, 29b). As shown in FIG. 5, for example, if the carrier 51 having a cutout 43 provided only at one end of one of the leg portions described above is placed on the IN-side port 27, the carrier reverse placement detecting sensor 47 stays ON. If, on the other hand, the carrier 51 is placed to a position 180°-displaced from the position shown in FIG. 5, the carrier reverse placement detecting sensor 47 is ON and the control section detects that the carrier 51 is placed in the 180°-displaced state. By identifying the reverse placement of the carrier, the direction of a processed side of the wafers 50 being received in the carrier 51 is prevented from being reversed during conveying of the carrier 51.

Although an explanation has been given of the carrier rest 29 at the IN-side port 27, the carrier rest 30 of the OUT-side port 28 is similarly formed having carrier presence/absence identification sensors 45 and carrier reverse placement detecting sensors 47. Further, the carrier rests 25 and 26 of the IN- and OUT-side stations 23 and 24 are similarly formed having carrier presence/absence identification sensors 45 and carrier reverse placement detecting sensors 47.

The IN-side port 27, OUT-side port 28, IN-side station 23 and OUT-side station 24 can be of such a type that no dust occurs, even upon contact with the carrier 51, for which, for example, a vinyl chloride resin is employed. A anti-static treatment can be performed to the vinyl chloride resin.

Carrier holding members 33 and 34 are provided in the stock unit 1 such that the carriers 51 on the IN- and OUT-side ports 27 and 28 are held from beneath the IN- and OUT-side ports 27 and 28, respectively, as shown in FIG. 3. As shown in FIG. 5, the carrier holding members 33 comprise a main rod 55, projection rods 56 and 58 provided on both ends of the main rod 55 and a projection rod 57 provided at the middle of the main rod 55 to provide an E-shaped unit. The spacings between the projection rods 56 and 57 and projection rods 57 and 58 are so dimensioned as to allow the carrier rests 29 and 30 of the IN- and OUT-side ports 27 and 28 to pass therethrough. Forward ends 56a and 58a of the projection rods 56 and 58 are key-shaped such that they can pass through the grooves 48 and 49 of the carrier rests 29 and 30, as described above. A forward end 57a of the projection rod 57 is T-like in configuration so that it can pass through the groove 43 of the carrier rests 29 and 30 as described above.

Figure 6:
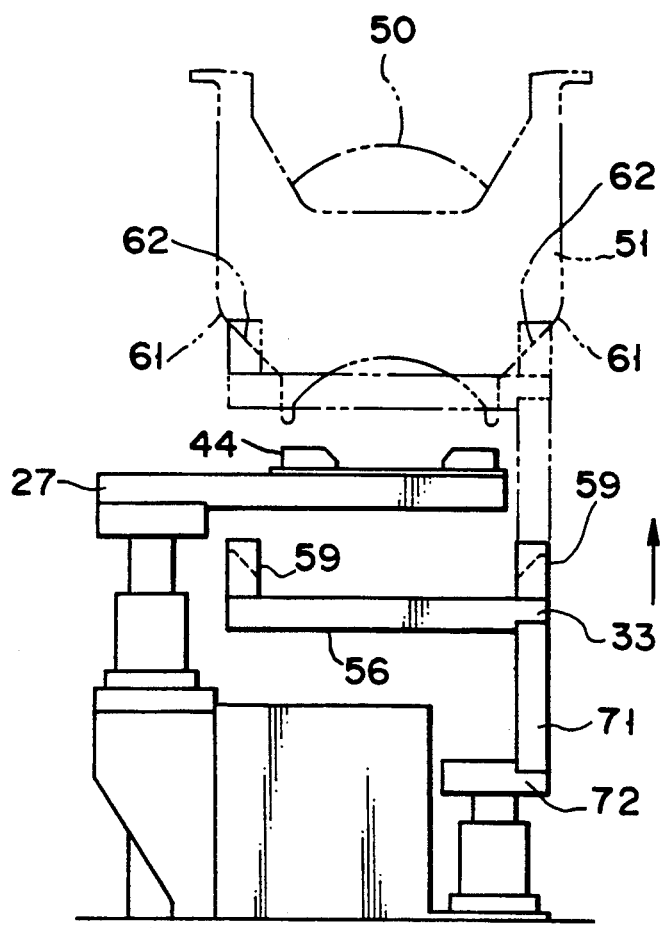
FIG. 6 is a side view showing a major section of the carrier conveying apparatus according to the embodiment of the present invention.

As shown in FIG. 6, support portions 59 are provided on those forward ends 56a, 57a and 58a of the projection rods 46, 47 and 48, and on the main rod 55, at those areas corresponding to upper shoulders 61 of inclined surfaces 62 at the base portion of the carrier 51 and, when the carrier 51 are to be held, support at the upper shoulders 61 of the inclined surfaces set out above. The support portions 59 have a inclined surfaces to corresponding to the inclined surfaces 62 set out above.

The carrier holding members 33 and 34 are made of, for example, aluminum alloy (A5052P).

Although the carrier holding members 23 and 24 have been explained in conjunction with the present embodiment, the present embodiment is not restricted thereto and it may be possible to hold opposed flanges 54 as provided at upper edges of the carriers 51.

Figure 7:
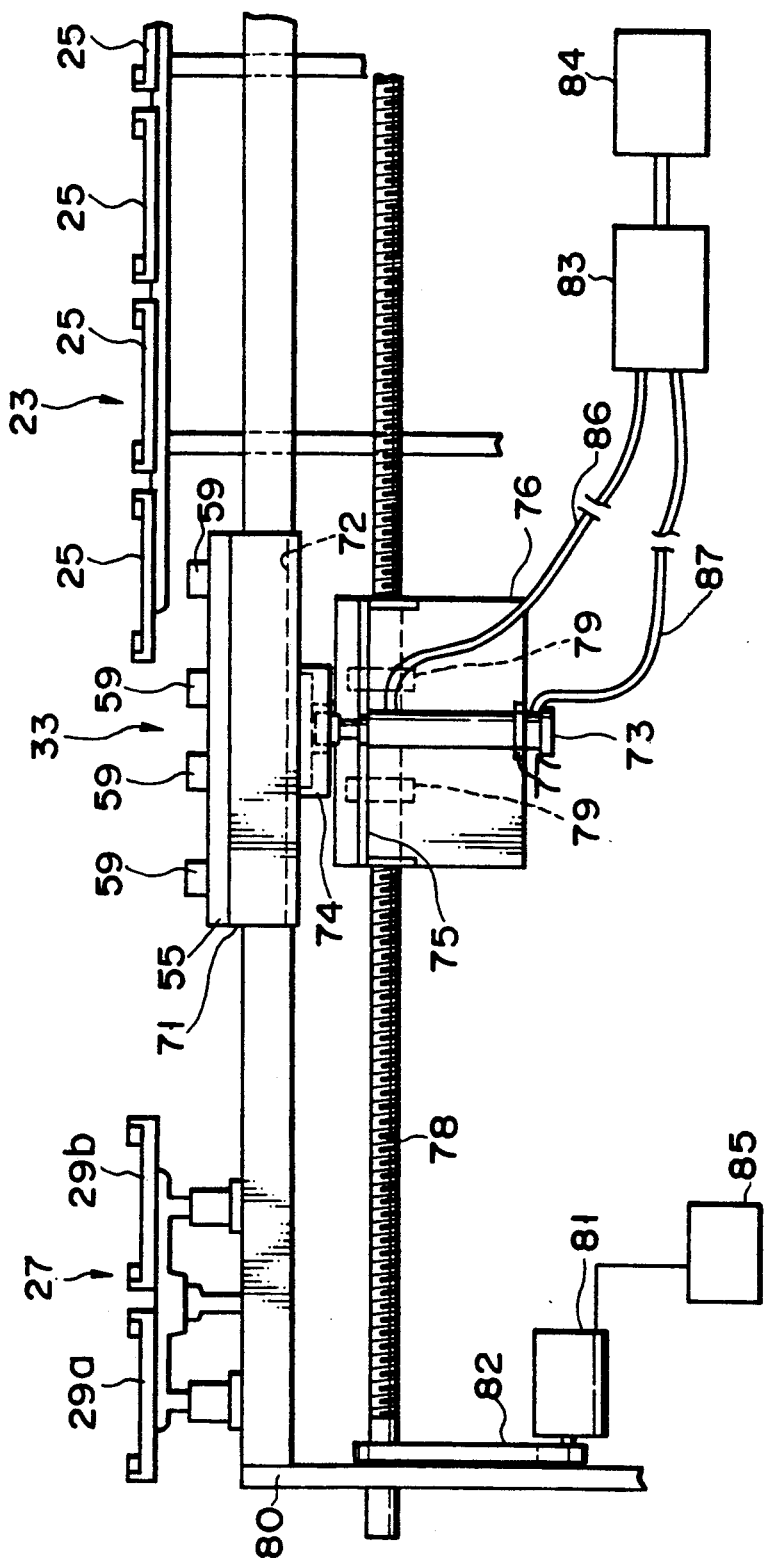
FIG. 7 is a front view showing a major section in the carrier conveying apparatus according to the embodiment of the present invention.

A liftable means is mounted on the carrier holding members 33 and 34 to lift the latter 33 and 34. As shown in FIGS. 6 and 7, a support plate 71 is vertically mounted on the main rod 55 of the carrier holding member 33 of the IN-side. A liftable means mounting plate 72 is vertically mounted on the lower end of the support plate 71. Substantially in the middle of the mounting plate 72, an air cylinder 73 is mounted through a mounting member 74. The upper end of the cylinder section of the air cylinder 73 is fixed to a body 76 by an air cylinder holding plate 75 projected from the body 76. The lower end of the cylinder section of the air cylinder 73 is fixed to the body 76 by a fastening metal fitting 77 projecting from the body 76.

Figure 8:
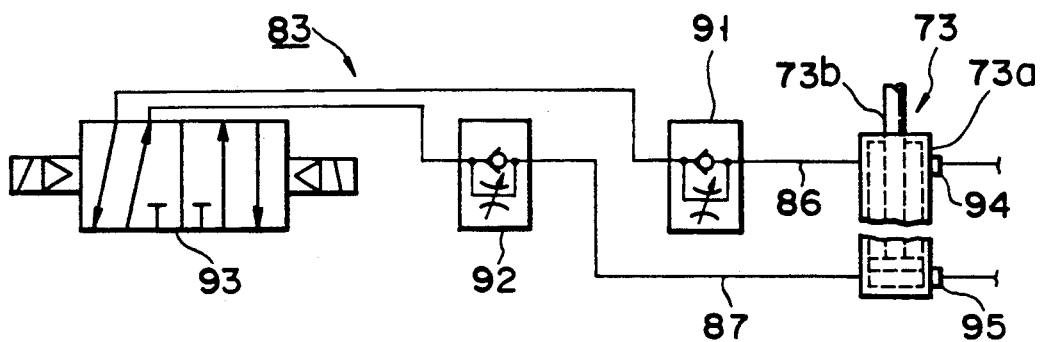
FIG. 8 is an explanative view showing a first control section in the embodiment of the present invention.

An air compressor 84 is connected through air tubes 86, 87 and first control section 83 to the upper and lower ends of the cylinder section of the air cylinder 73. The first control section 83 comprises, as shown in FIG. 8, speed controllers 91 and 92 connected through air tubes 86 and 87 to the upper and lower ends of the cylinder body 73a of the air cylinder 73 and a 2-position double solenoid valve 93 connected to the speed controllers 91 and 92. An air compressor 84 is connected to an air supply side of the 2-position double solenoid valve 93. Sensors 94 and 95 are provided on the upper and lower end portions of a cylinder section 73a of the cylinder 73, respectively, to detect the position of the piston head of the piston section 73b. The sensors 94 and 95 and 2-position double solenoid valve 93 are electrically connected to a central processing unit, not shown.

On that side of the body 76 opposite to that on which the air cylinder 73 is fixed, a ball screw 78 is mounted through mounting metal fittings 79 in a direction perpendicular to the air cylinder 73. On a base 80 on which the IN-side port 27 and IN-side station 23 are located, the ball screw 68 is mounted for a distance from the end portion of the base 80 near the IN-side port 27 to the other end portion near the IN-side station 23.

A stepping motor 81 for rotating the ball screw 78 is connected by a belt 82 to the end portion of the ball screw 78 on the IN-side port 27 side. A second control section 85 is electrically connected to the stepping motor 81.

Although an explanation has been made of the IN-side section of the stock unit 1, an air cylinder 73, ball screw 78, etc., are similarly arranged even relative to the carrier holding section 34 on the OUT-side port 28 and OUT-side station 24.

The conveying of the carriers by the carrier conveying apparatus will be explained below.

Process 1

Figure 9A:
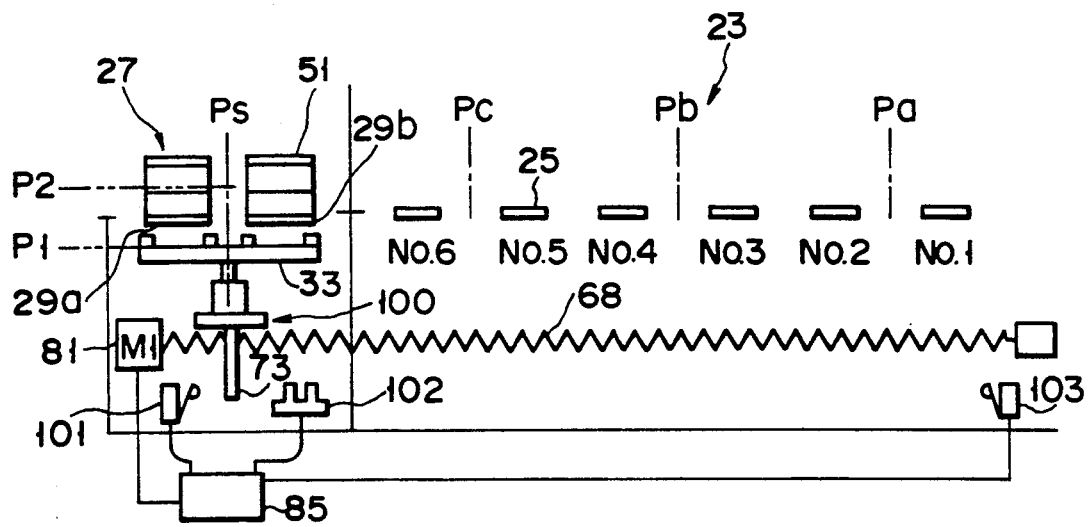
FIGS. 9A to 9E are explanative views showing the processes of conveying carriers on the embodiment of the present invention.

First, as shown in FIG. 9A, the stepping motor 81 is operated in accordance with a control signal outputted from the second control unit 85, rotating the ball screw 78 and moving a carrier lifting means 100 toward the IN-side port 27. In this connection it is to be noted that the carrier lifting means 100 comprises the carrier holding section 33 and air cylinder 73. In this case, if, the moving carrier lifting means 100 cuts off an overrun limit switch 101 situated in the end poritn near the IN-side port 27, noting that the overrun limit switch 101 is adapted to detect an overrun of the carrier lifting means 100 and to be turned ON and OFF in accordance with a result of detection. By so doing, the carrier lifting means 100 is stopped and warns an operator by an alarm of this mistake.

When the reverse-rotating carrier lifting means 100 reaches a predetermined sits Ps in FIG. 9A below the IN-side port 27, the carrier lifting means 100 is stopped. Here, the overrun limit switch 101 is electrically connected to the second control section 85.

Process 2

Figure 9B:
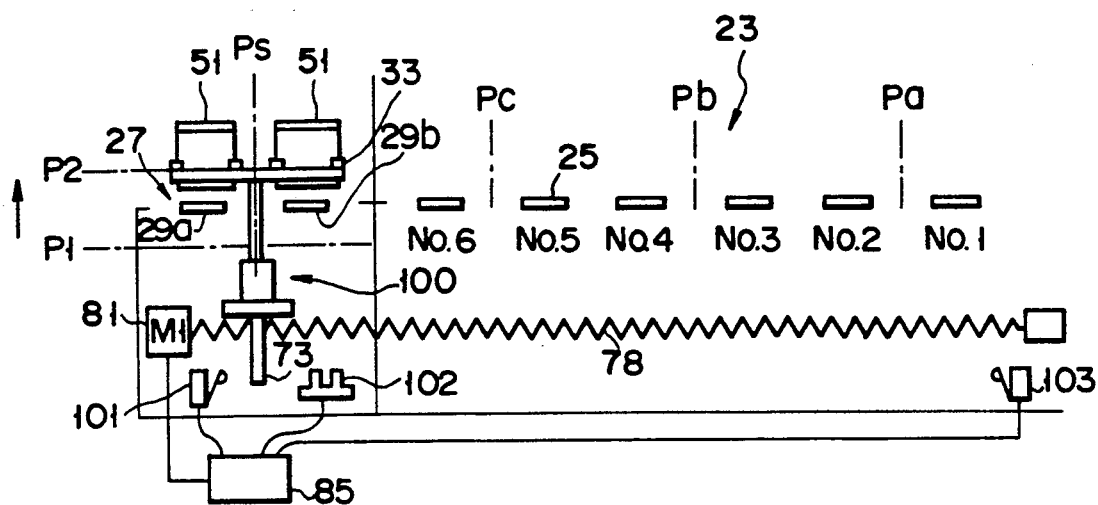

Then as shown in FIG. 9B, when the carrier presence/absence detecting sensors 45a, 45b (see FIG. 4) detect that the carriers 51 are loaded from another manufacturing line toward the IN-side port 27, the first control section 83 as set out above operates the air cylinder 73. By so doing, the carrier holding member 33 is lifted from a height level Pl to a height level P2. As a result, the carrier holding member 33 lift up the carriers 51 from be neath as described above.

Process 3

Figure 9C:
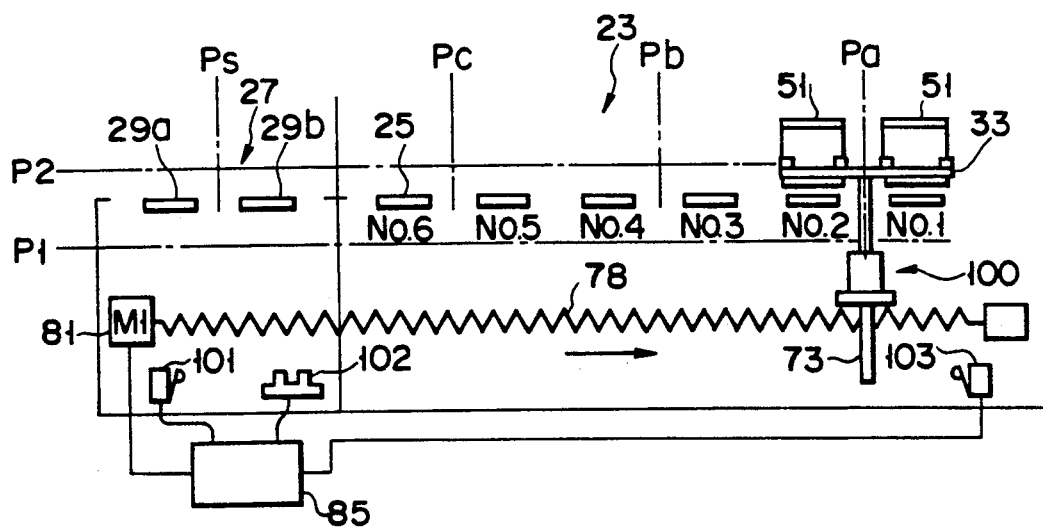

Then as shown in FIG. 9C, responsive to an output signal from the second control section 85, the stepping motor 81 is operated, allowing the carrier lifting means 100 which lifts up the carriers 51 to be moved from the basic site Ps toward the IN-side station 23. The carrier lifting means 100 is stopped to any one of sites of the six carrier rests in the IN-side station 23, that is, a site Pa between No. 1 carrier rest and No. 2 carrier rest, a site Pb between No. 3 carrier rest and No. 4 carrier rest and a site Pc between No. 5 carrier rest and No. 6 carrier rest.

An overrun limit switch 103 is mounted on the end near the IN-side station 23. When the carrier lifting means 100 is run and the overrun limit switch 103 is turned OFF, the carrier 100 is stopped and warns an operator by an alarm as described in the process 1.

Process 4

Figure 9D:
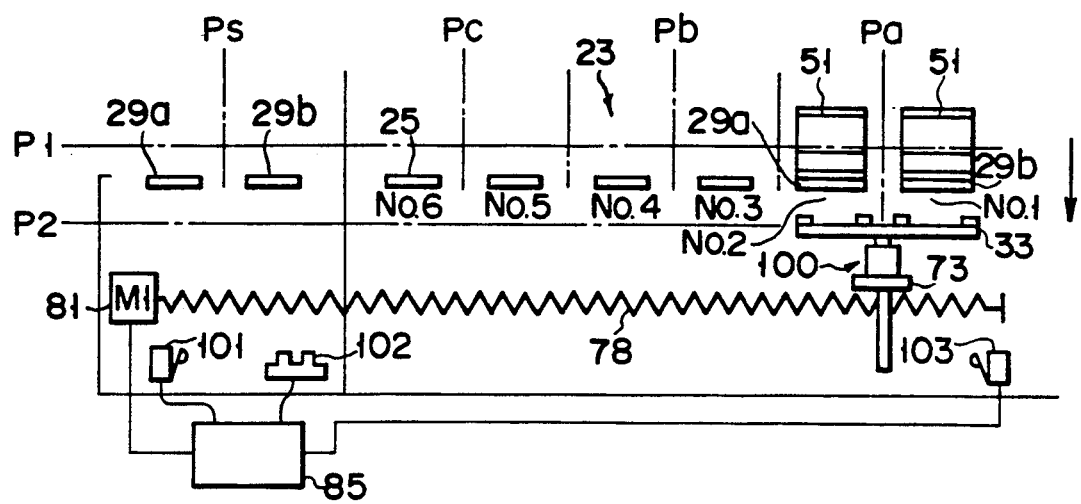

Then as shown in FIG. 9D, the air cylinder 73 is operated by the first control section 83, lowering the carrier holding means 33 from the height Pl to the height P2. By so doing, the carriers on the carrier holding means 33 are placed on the carrier rest 25 (No. 1 and No. 2).

Process 5

Figure 9E:
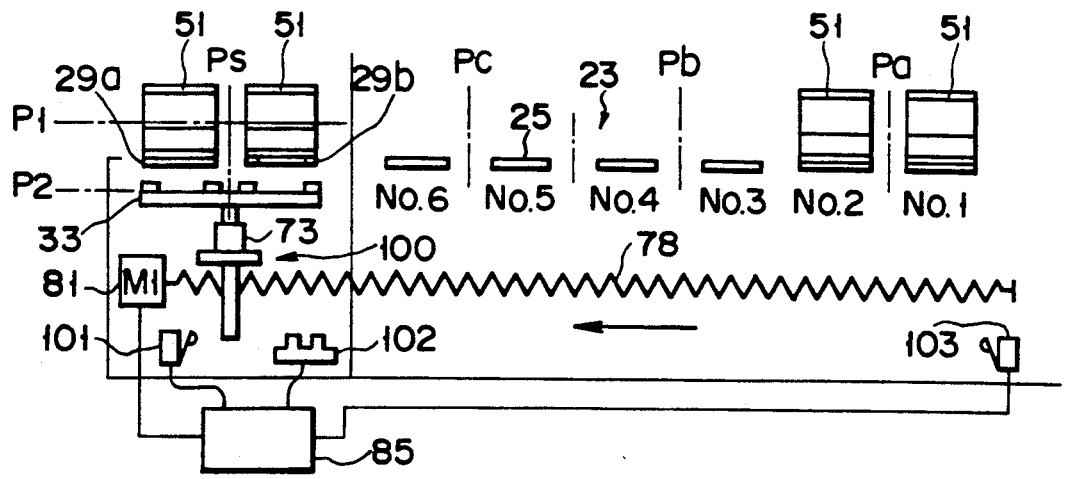

Finally as shown in FIG. 9E, the carrier lifting means 100 is moved from site Pa to the IN-side port 27 and returned back to the site Ps, being ready for the next carriers 51 to be loaded into the IN-side port 27.

The rise or fall of the carrier holding member 23, as set up in process 1 to 5, is accomplished by the first control section 83 and air compressor 84. That is, responsive to an output signal of the central processing unit set out above, the 2-position double solenoid valve 93 is switched and air is supplied into the air cylinder 73 in accordance with an ordinary method. By so doing, the air cylinder 73 is operated, raising and lowering the carrier holding member 33. In this case, the height of the carrier holding member 33 is identified by detecting the position of the piston head of the piston section 73b of the air cylinder 73. The operation speed of the air cylinder 73 is executed by adjusting the extent of restriction of the speed controllers 91 and 92 to perform air exhaust control (meter-out).

Stopping the carrier lifting means 100 to any one of sits Ps to Pc in the carrier conveying step as set out above is done as follows: First, the site pulse numbers corresponding to the sites Ps to Pc are initially memorized in the second control section 85. The stepping motor 91 is rotated, by the second control section 85, by an amount corresponding to the number of pulses necessary to move from a present site to a designated site, rotating the ball screw 78 and moving the carrier lifting means 100 to the designated site. When the site pulse number are set to 5000 P (pulses) for the site Ps, 60000 P for the site Pa, 40000 P for the site Pb and 20000 P for the site Pc. In this case, the carrier lifting means 100 is moved from the site Ps to Pa, the stepping motor 81 is rotated by an amount corresponding to Pa−Ps=60000−5000=55000 P. If, here, a fine pitch is employed for the ball screw 78, it is possible to improve the accuracy with which the means 100 moves to the stop position.

In the case where the second control section 85 does not identify the position of the carrier conveying means 100 when, for example, the power supply is turned ON, the basic point detection sensor 102 located below the IN side port 27 is employed to identify the position of the carrier conveying means 100. That is, the carrier conveying means 100 is horizontally moved in a predetermined direction when the power supply is turned ON. The basic detection sensor 102 detects the carrier conveying means 100 and steps it. The second control section 85 identifies the stop position, that is, the basic point, as a corresponding pulse number (for example, 4000 P) which is initially set in the second control section 85. The process of the conveying of the carriers, as described above, can be automatically performed according to a program previously memorized.

Repeating the conveying of the carriers in this way, the carriers 51 are conveyed on all the carrier rests 25 in the IN-side 23.

The carriers 51 placed on the IN-side station 23 in this way are gripped, as shown in FIG. 3, by the holding mechanism 36 of the aforementioned carrier arm 37 and allow transfer to be made relative to the IN-side station 23, OUT-side station 24, carrier conveying plate 35 and shelf 21.

In this way, the carriers 51 are stored in the stock unit 1 and transferred to the carrier conveying plate 35 as required. The conveying plate 35 is moved in the X-axis direction in FIG. 3 and conveys the carriers 51 placed thereon to the transfer mechanism 2. In this case, number of the carriers 51 which placed at same time is corresponding to number of wafers held onto the wafer boat at same time, example, four carriers. The wafers held in the carriers 51 are transferred onto the wafer boat. The wafers are loaded into the furnace 16 by a boat transfer mechanism 13, boat conveying mechanism 14 and elevator 15 in FIG. 2. Then a predetermined process gas is supply to the process tube from the gas supply source 17 and the wafers are heat-treated.

The heat-treated wafers are taken by the elevator 15 out of the furnace 16. Then those wafers in the wafer boat are conveyed to the transfer mechanism 2 by the boat conveying mechanism 14 and boat transfer mechanism 13. The wafers in the wafer boat are taken out by the transfer mechanism 2 and held in the carrier 51. The carriers 51 with the wafers held therein are placed on the carrier conveying plate 35 and moved to a position beneath the stock unit 1. Then the carrier arm 37 can hold six wafers on the carrier conveying plate 35 at a time and transfers them to the OUT-side station 24 or the shelf 21.

Those carriers 51 to be delivered to another manufacturing line. First, the carriers 51 are transferred by the carrier arm 27 from the OUT-side station 24. Then the carriers 51 are conveyed, by the carrier holding member 34, from the OUT-side station 24 to the OUT-side port 28 as in the aforementioned Processes 1 to 5 and delivered out of the OUT-side port 28 to another manufacturing line.

According to the carrier conveying apparatus of the present invention, as set out above, the carrier holding members 33 and 34 convey the carriers 51 in a manner to be held from beneath the carriers 51 and, therefore, there is no motion of, the carrier holding members 33 and 34 over the carriers 41. For this reason, dust is hard to raise. Even if dust is raised, it occurs below the carriers 51 and is less likely to be deposited on the wafers held in the carrier 51. As a result, a yield in semiconductor elements (finished products) is improved.

In the carrier conveying apparatus of the present invention, two carriers 51 can be conveyed at a time with the use of the E-shaped carrier holding members 33 and 34. Further, the carrier holding members 33 and 34 can convey the carriers 51 simply by moving them in the up/down direction and in the horizontal direction. For this reason, it is possible to decrease the occupation area of the carrier conveying apparatus.

Figure 10:
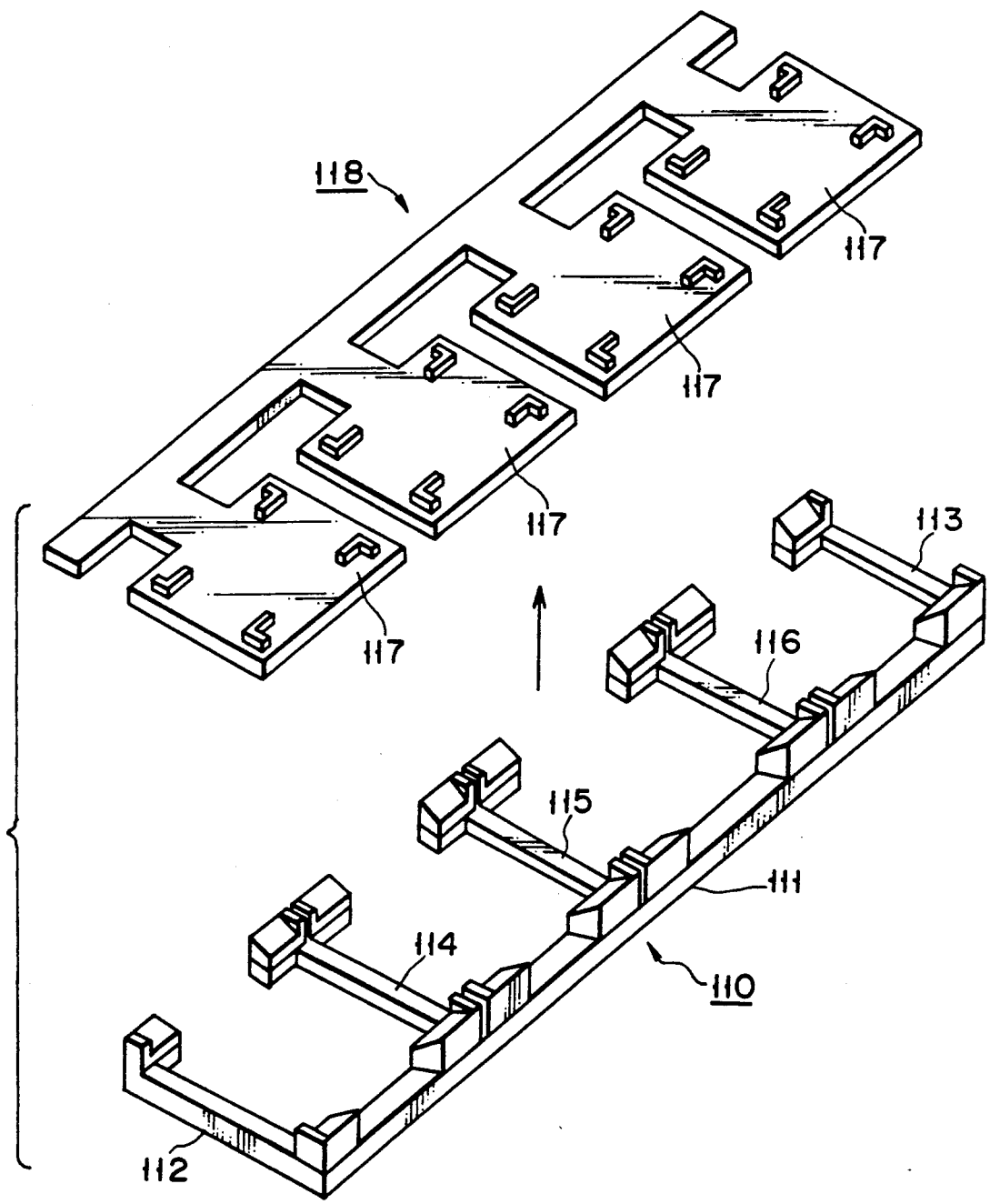
FIG. 10 is a perspective view for showing a port and a carrier holding member in another embodiment of the present invention.

Although, in the present embodiment, the carrier holding member has been explained as holding two carriers at a time, by way of example, it may be so formed as to be able to hold four carriers at a time, for example, as shown in FIG. 10 in which case the carrier holding member comprises a main rod 111, a pair of projection rods one at each end of the main rod 111 and intermediate projection rods 114, 115 and 116 located at a given interval between the projection rods 112 and 113. According to the carrier holding member 110, four carriers, not shown, can be held at a time on a port 118 with four carrier rests 117 correspondingly placed at a given interval relative to the four carriers.

In an arrangement shown in FIG. 11, carriers 121 held by a E-shaped port 123 having the same configuration as that of the carrier holding member 33 can be lifted up, by a carrier member 120, from beneath the carriers 121 and be placed on square-like carrier holding plates 122, noting that, in this case, the carrier member 120 has the square-like carrier holding members 122 corresponding in configuration to the bottoms of the carriers 121.

Although, in the aforementioned embodiment, the carrier conveying apparatus of the present invention has been explained as applying to the stock unit of the semiconductor heat treating system for use in the heat treatment of semiconductor wafers in a batch, the carrier conveying apparatus of the present invention cannot be restricted thereto. For example, the present invention can also apply to the conveying of carriers in which a plurality of plates can be held, for example, in the step of manufacturing a semiconductor device, LCD, and so on.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A carrier conveying apparatus, comprising:
   a first carrier rest on which carriers are placed, said first carrier rest being square in configuration;
   a second carrier rest;
   a carrier holding member for holding carriers from beneath the carrier, said carrier holding member having a plurality of projection rods projected from a main rod with a spacing defined between the adjacent projection rods to allow the carrier rest to pass through the spacing; and
   carrier holding member driving means for lifting the carrier holding member from beneath the first carrier rest and, by doing so, lifting the carriers which are placed on the first carrier rest with the carriers held by the carrier holding member, moving the carrier holding member in a horizontal direction and placing the carriers on the second carrier rest after the carrier holding member has been lowered toward the second carrier rest.

2. The carrier conveying apparatus according to claim 1, comprising at least two carrier-holding members.

3. The carrier conveying apparatus according to claim 1 wherein the carrier holding member has three projection rods.

4. The carrier conveying apparatus according to claim 1, wherein the carrier holding member has five projection rods.

5. The carrier conveying apparatus according to claim 1, wherein the carrier rest includes a sensor for detecting whether or not the carriers are placed on the carrier rest.

6. The carrier conveying apparatus according to claim 1, wherein the carrier rest includes a sensor for detecting the direction in which the carrier is placed on the carrier rest.

7. The carrier conveying apparatus according to claim 1, wherein the carrier holding member driving means comprises liftably moving means for liftably moving the carrier holding member; horizontally moving means for horizontally moving the carrier holding member; and a control section for controlling the liftably moving means and horizontally moving means.

8. The carrier conveying apparatus according to claim 7, wherein the liftably moving means comprises an air cylinder and an air supply source for supplying air to the air cylinder.

9. The carrier conveying apparatus according to claim 7, wherein the horizontally moving means comprises a ball screw and rotationally driving section for rotationally driving the ball screw.

10. The carrier conveying apparatus according to claim 9, wherein the rotationally driving section is comprised of a stepping motor.

11. The carrier conveying apparatus according to claim 1, wherein the carrier is a wafer carrier.

12. The carrier conveying apparatus according to claim 1, wherein the projection rod has a polygonal cross sectional shape.

13. The carrier conveying apparatus according to claim 1, wherein the projection rod has a circular cross sectional shape.

14. The carrier conveying apparatus according to claim 1, wherein at least one of the carrier rest and the carrier holding member includes means for determining the position of the carrier.

15. A carrier conveying apparatus, comprising:
   a first carrier rest having a plurality of projection rods projected from a main rod, carriers being placed on adjacent projection rods;
   a second carrier rest;
   a carrier holding member for holding carriers from beneath the carrier, said carrier holding member being square in configuration and capable of passing through a spacing defined between the adjacent projection rods; and
   carrier holding member driving means for lifting the carrier holding member from beneath the first carrier rest and, by doing so, lifting the carriers which are placed on the first carrier rest with the carriers held by the carrier holding member, moving the carrier holding member in a horizontal direction and placing the carriers on the second carrier rest after the carrier holding member has been lowered toward the second carrier rest.

16. The carrier conveying apparatus according to claim 15, wherein the apparatus includes at least two carrier holding members.

17. The carrier conveying apparatus according to claim 15, wherein the carrier rest has three projection rods.

18. The carrier conveying apparatus according to claim 15, wherein the carrier rest has five projection rods.

19. The carrier conveying apparatus according to claim 15, wherein the projection rod has a polygonal cross section shape.

20. The carrier conveying apparatus according to claim 15, wherein the projection rod has a circular cross sectional shape.

21. The carrier conveying apparatus according to claim 15, wherein at least one of the carrier rest and the carrier holding member includes means for determining the position of the carrier.

22. The carrier conveying apparatus according to claim 15, wherein the carrier rest includes a sensor for detecting whether or not the carriers are placed on the carrier rest.

23. The carrier conveying apparatus according to claim 15, wherein the carrier rest includes a sensor for detecting the direction in which the carrier is placed on the carrier rest.

24. The carrier conveying apparatus according to claim 15, wherein the carrier holding member driving means comprises liftably moving means for liftably moving the carrier holding member; horizontally moving means for horizontally moving the carrier holding member; and a control section for controlling the liftably moving means and horizontally moving means.

25. The carrier conveying apparatus according to claim 24, wherein the liftably moving means comprises an air cylinder and an air supply source for supplying air to the air cylinder.

26. The carrier conveying apparatus according to claim 24, wherein the horizontally moving means comprises a ball screw and rotationally driving section for rotationally driving the ball screw.

27. The carrier conveying apparatus according to claim 26, wherein the rotationally driving section is comprised of a stepping motor.

* * * * *

UNITED STATES PATENT AND TRADEMARK OFFICE
CERTIFICATE OF CORRECTION

PATENT NO. : 5,203,445

DATED : April 20, 1993

INVENTOR(S) : Hirotsugu Shiraiwa

It is certified that error appears in the above-identified patent and that said Letters Patent is hereby corrected as shown below:

On the title page, Item [30],

The Foreign Application Priority Data is incorrect, should read:

--Aug. 17, 1990  [JP]  Japan.................2-216910--

Signed and Sealed this

Eleventh Day of January, 1994

*Attest:*

BRUCE LEHMAN

*Attesting Officer*  *Commissioner of Patents and Trademarks*